United States Patent
Zhang

(10) Patent No.: US 10,050,434 B1
(45) Date of Patent: Aug. 14, 2018

(54) DEVICE AND METHOD FOR INRUSH CURRENT CONTROL

(71) Applicant: Shanghai Huali Microelectronics Corporation, Shanghai (CN)

(72) Inventor: Xueyuan Zhang, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 15/638,383

(22) Filed: Jun. 30, 2017

(30) Foreign Application Priority Data

Mar. 27, 2017 (CN) .......................... 2017 1 0187522

(51) Int. Cl.
| | |
|---|---|
| *H02H 9/00* | (2006.01) |
| *G05F 1/10* | (2006.01) |
| *H03K 17/082* | (2006.01) |
| *H03K 17/16* | (2006.01) |
| *H02M 1/00* | (2006.01) |

(52) U.S. Cl.
CPC ............ *H02H 9/002* (2013.01); *G05F 1/10* (2013.01); *H03K 17/082* (2013.01); *H03K 17/165* (2013.01); *H02M 2001/0003* (2013.01); *H03K 2217/00* (2013.01)

(58) Field of Classification Search
CPC ........ H02H 9/002; G05F 1/10; H03K 17/082; H03K 17/165
USPC .......... 326/33, 26, 27, 86, 87; 327/108, 109; 333/17.3, 32
See application file for complete search history.

(56) References Cited

U.S. PATENT DOCUMENTS

| | | | | |
|---|---|---|---|---|
| 2006/0038591 | A1* | 2/2006 | Pan ................... | H03K 19/00384 327/108 |
| 2008/0043566 | A1* | 2/2008 | Fujisawa .............. | G11C 7/1072 365/233.1 |
| 2008/0088387 | A1* | 4/2008 | Xiong ....................... | H03F 1/56 333/32 |
| 2010/0013447 | A1* | 1/2010 | Furuse .................. | H02M 3/157 323/234 |
| 2015/0222271 | A1* | 8/2015 | Singh .................... | H03K 21/10 327/115 |

* cited by examiner

*Primary Examiner* — Dylan White
(74) *Attorney, Agent, or Firm* — Tianchen LLC

(57) ABSTRACT

An inrush current control device for an IC chip having multiple functional units and M power switches comprises a programmable counter unit, a selector unit and an enable signal driving unit. The programmable counter unit counts a clock signal and sets a predetermined counting value. The selector unit is connected to the programmable counter unit and has N output ports for outputting N enable signals. The enable signal driving unit has N enable driving circuits correspondingly connected to the N output ports of the selector unit, and controlling on/off states of N groups of the M power switches. The programmable counter unit controls the selector unit to output the N enable signals to the N enable signal driving circuits at a predetermined time interval determined by the predetermined counting value to switch on the N power switches groups successively to reduce the transient inrush current.

10 Claims, 2 Drawing Sheets

DEVICE AND METHOD FOR INRUSH CURRENT CONTROL

CROSS-REFERENCE TO RELATED APPLICATION

This application claims the priority benefit of China application serial no. 201710187522.0, filed Mar. 27, 2017. All disclosure of the China application is incorporated herein by reference.

FIELD OF THE INVENTION

The present invention relates to the field of digital circuit design, and more particularly to a device and method for inrush current control.

BACKGROUND OF THE INVENTION

In order to save power and increase the life span of batteries, the low power consumption design is highly demanded in integrated circuit chips for mobile devices. In the low power consumption design, turning off the power supply to idle circuit modules of the integrated circuit chips is one of the main ways to achieve power savings.

A power switch is usually designed in a chip to control the on/off state of a circuit module. When the circuit module is in an idle state, the power switch turns off the power supply to the circuit module to save power; while when the circuit module needs to be re-activated, the power switch turns on the power supply to the circuit module.

FIG. 1 is a circuit diagram of a power switch in a conventional low power consumption chip. As shown in the figure, the circuit module includes multiple PMOS transistors each receives an enable signal EN output from a power control circuit inside the chip to be switched on or switched off. Wherein, VDD indicates an external power supply, VDDC indicates a module power supply for the circuit module. The enable signal EN controls the connection between the external power supply VDD and the module power supply VDDC.

Here we use the PMOS to implement the power switch because a PMOS usually has a lower leakage current. However, NMOS can be used to implement the power switch too. The advantage of using NMOS is smaller area and faster switching speed.

FIG. 2 shows two layout structures of the power switch in the integrated circuit chip. As shown in the figure, the power switch can be arranged in the chip in the following two ways:

① in columns crossing the circuit module
② surrounding the periphery of the circuit module Although such layout structures can effectively reduce the power consumption of the chip, it also bring some adverse effects. Specifically, great amounts of power switches are required to ensure sufficient power supply to the circuit module and reduced the on-resistance. However, the PMOS transistors also bring huge capacitive loads at the same time, which will cause a large transient current (inrush current) when charging the capacitive loads all at once.

It is well known to those skilled in the art that inrush current, also named surge, generates at the instant of turning on the power supply to the circuit module. In other words, a current instantly reaches its peak beyond a stable value. Such huge transient currents will negatively affect the reliability of the chip. If the power supply to the circuit module is not designed properly, the large current may cause electro migration and lead to an open circuit or a short circuit, resulting in abnormality or failure of the chip function. Furthermore, excessive transient currents may also burn the chip, and even cause a fire, or other equipment damage or personnel injuries.

SUMMARY OF THE INVENTION

The aim of the invention is to provide a device and method to control the inrush current, which uses a programmable counter and a selector to control the inrush current, so as to enhance the reliability of the chip, reduce the wiring of the power supply network, thereby increasing the chip life span and reducing the cost.

To achieve these and other advantages and in accordance with the objective of the invention, as embodied and broadly described herein, the invention provides an inrush current control device used in an integrated circuit chip. The integrated circuit chip includes multiple functional units and M power switches controlling power supply to the multiple functional units. The inrush current control device comprises a programmable counter unit, a selector unit, and an enable signal driving unit. The programmable counter unit has an input port receiving a clock signal and output ports connected to input ports of the selector unit to control outputs of the selector unit. The M power switches are divided into N groups respectively connected with N enable signal driving circuits of the enable signal driving unit. The selector unit has N output ports respectively outputting N enable signals to the N enable signal driving circuits, the N enable signal driving circuits control on/off states of the N groups of power switches accordingly; wherein N and M are positive integers greater than 1, N is less than M.

The programmable counter unit sets a predetermined counting value and counts the clock signal, and also controls the selector unit to output the N enable signals to the N enable signal driving circuits at a predetermined interval which is determined by the predetermined counting value. That is, the N groups of power switches are switched on successively at the predetermined interval, thus to reduce the transient inrush current.

Furthermore, the M power switches are divided into N groups according to space occupation, wirings and metal layers used in the integrated circuit chip, driving capacitance and the amount of the power switches.

Furthermore, each group of the power switches has 100-10000 power switches.

Furthermore, N is between 2 to 100.

Furthermore, the predetermined time interval is in nanoseconds to microseconds.

Furthermore, the programmable counter unit counts an internal clock signal of the integrated circuit chip or an external clock signal.

Furthermore, the power switch is a PMOS transistor whose gate receives the enable signal.

Furthermore, the power switch is a NMOS transistor whose gate receives the enable signal.

Furthermore, the integrated circuit chip is designed to be low power consumption.

To achieve these and other advantages and in accordance with the objective of the invention, the present invention further provides an inrush current control method using the above-mentioned inrush current control device, which comprises the following steps:

S1: dividing the M power switches into N groups, and connecting the N groups of the power switches respectively with the N enable signal driving circuits; connecting the N enable signal driving circuits respectively to the N output ports of the selector unit; wherein N and M are positive integers, N is less than M;

S2: the programmable counter unit setting the predetermined counting value and counting the clock signal to control the selector unit to output the N groups of the enable signals to the N groups of power switches at a predetermined interval determined by the predetermined counting value, so as to switch on the N groups of the M power switches successively at the predetermined time interval to reduce transient inrush current.

According to the above technical solution, the power switches are divided into multiple groups to be switched on successively, which effectively controls the transient inrush current, increases the reliability of the chip, saves the layout wiring resources and reduces the chip manufacturing cost.

DETAILED DESCRIPTION OF THE EMBODIMENTS

The inrush current control device and method of the present invention will be described in further details hereinafter with respect to the embodiments and the accompanying FIG. 3.

It is noted that, in the present invention, a programmable counter unit and a selection unit are provided in the inrush current control device, so as to control the inrush current, increase the reliability of the IC chip, reduce the layout wiring resources of the power supply network, enhance the reliability of the IC chip and reduce the manufacturing cost.

Figure 3:
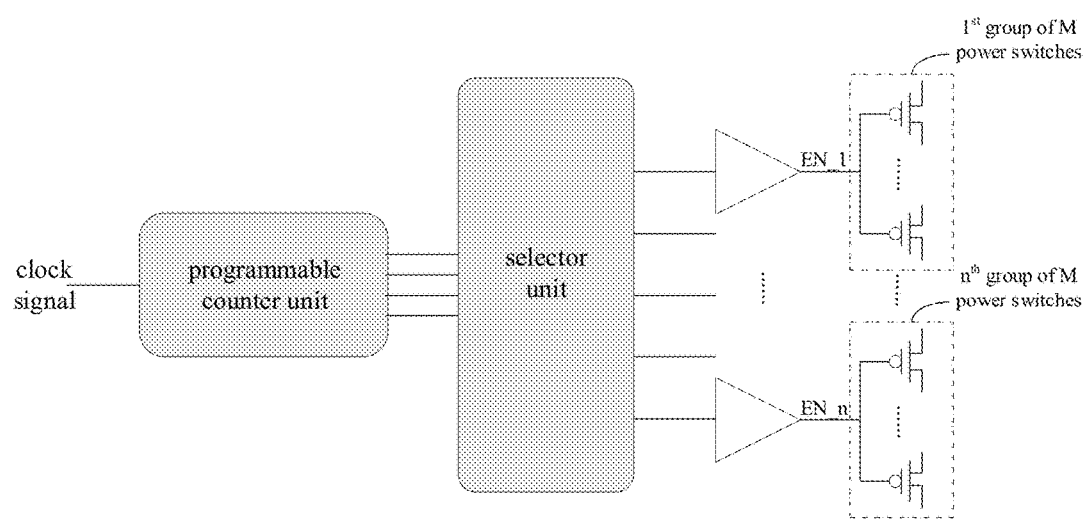
FIG. 3 is a diagram showing an inrush control device according to an embodiment of the present invention.

FIG. 3 illustrates an inrush current control device according to a preferred embodiment of the present invention. As shown in FIG. 3, the IC chip comprises multiple functional units and M power switches controlling the power supply to the functional units, wherein M is a positive integer greater than 1. In order to ensure power supply to all the functional units, thousands of power switches are provided in the IC chip. These power switches can be arranged surrounding the periphery of the functional units, or arranged in columns crossing the functional units, which is not limited thereto.

Figure 1:
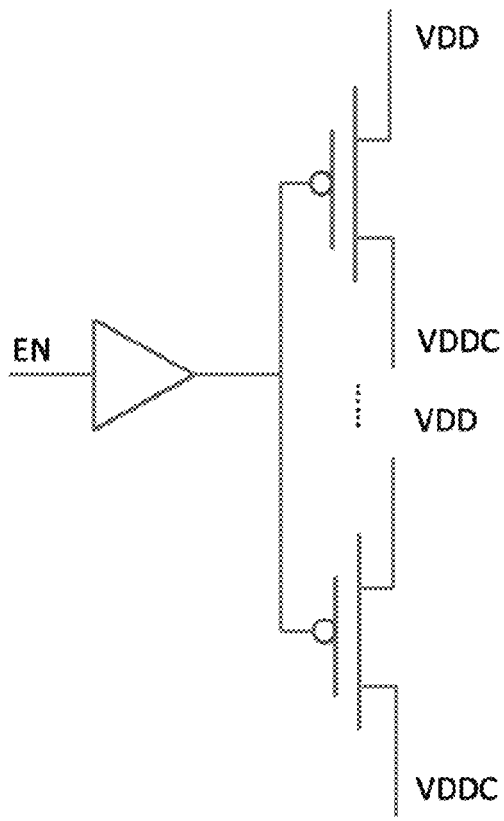
FIG. 1 is a diagram of a circuit module of power switch using PMOS in a conventional low power consumption chip.
Figure 2:
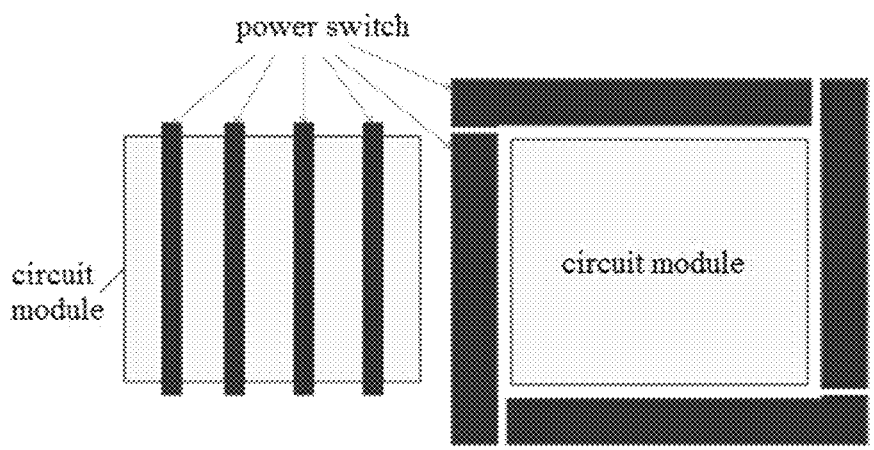
FIG. 2 is a diagram showing two layout structures of the power switches in the integrated circuit chip.

In the embodiment, the IC chip is designed to be with low power consumption. One single power transistor may have different configurations. For example, as shown in FIG. 1, the power switch can be a PMOS transistor, with a gate terminal receiving an enable signal EN which controls the on/off state of the PMOS transistor, a source terminal connected to an external power supply VDD, a drain terminal connected to a module power supply VDDC for the functional unit. The enable signal EN controls the connection between the external power supply VDD and the module power supply VDDC.

Different from the prior art, the inrush current control device comprises a programmable counter unit, a selector unit and an enable signal driving unit. The programmable counter unit has an input port receiving a clock signal and outputs port connected to input ports of the selector unit to control the outputs of the selector unit.

In order to reduce the transient current generated when all the power switches are switched on simultaneously, the power switches are divided into different groups. For example, the M power transistors are divided into N groups, and are respectively connected with N enable signal driving circuits of the enable signal driving unit. The selector unit has N output ports respectively outputting N enable signals to the N enable signal driving circuits, and the N enable signal driving circuits respectively controls on/off states of the N groups of power switches according to the received enable signals; wherein N and M are positive integers greater than 1, N is less than M. It is noted that, the M power switches are divided into N groups according to multiple factors including space occupation, wirings and metal layers in the IC chip, driving capacitance and the amount of the power switches.

For example, the M power switches can be divided into 2, 4, 8 or 16 groups. Each power switch group can contain hundreds or thousands of power switches. Each power switch group corresponds to one enable signal EN_n, e.g. power switch group 1 corresponds to enable signal EN_1. Different enable signals are output at different time.

In the embodiment, the programmable counter unit controls the selector unit to output the enable signals to the N enable signal driving circuits at a predetermined time interval which is determined by a predetermined counting value set in the programmable counter unit. In other words, the N groups of power switches are switched on successively at the predetermined time interval, thus to reduce the transient inrush current. The programmable counter unit counts the clock signal, which can be an internal clock signal of the chip or an external clock signal. When the count attains the predetermined counting value, the programmable counter unit transmits signals to the selector unit. The selector unit responses to the signal transmitted from the programmable counter unit to output an enable signal EN_n to one group of power switches through a corresponding enable signal driving circuit. The programmable counter unit continues to count the internal clock signal or the external clock signal and controls the selector unit to output another enable signal to another group of the power switches when the count attains the predetermined counting value again. It is noted that, the N enable signals can be transmitted from the selector unit in a preset order (e.g. EN_1 to EN_N) or pseudorandomly. The time interval at which the N enable signals are transmitted are determined by the counting value set in the programmable counter unit, preferably be in nanoseconds to microseconds. For example, the enable signals EN_1, EN_2, . . . EN_N are switched on successively at the predetermined time interval of 10 nanoseconds.

According to the present invention, the multiple power switches can be switched on successively, which effectively controls the transient inrush current, increases the reliability of the chip, saves the layout wiring resources and reduces the chip manufacturing cost.

The above is only the preferred embodiment of the invention, the example is not intended to limit the scope of patent protection. Accordingly, all equivalents of structural changes using the specification and drawings of the present invention should be included within the scope of the present invention.

The invention claimed is:

1. An inrush current control device for an integrated circuit chip having multiple functional units and M power switches which control power supply to the functional units, comprising:

a programmable counter unit having an input port receiving a clock signal;

a selector unit having input ports connected to output ports of the programmable counter unit and N output ports for outputting N enable signals respectively;

an enable signal driving unit connected to the selector unit, having N enable driving circuits respectively controlling on/off states of N groups of the M power switches according to the enable signal transmitted from the output ports of the selector unit;

wherein, the programmable counter unit sets a predetermined counting value and counts the clock signal to control the selector unit to output the N enable signals to the N enable signal driving circuits at a predetermined time interval, so as to switch on the N groups of the M power switches successively at the predetermined time interval to reduce transient inrush current; wherein N and M are positive integers greater than 1, N is less than M.

2. The inrush current control device according to claim 1, wherein the M power switches are divided into N groups according to space occupation, wirings and metal layers used in the integrated circuit chip, driving capacitance and the amount of the power switches.

3. The inrush current control device according to claim 2, wherein each group of the power switches has 100-10000 power switches.

4. The inrush current control device according to claim 1, wherein N is between 2 to 100.

5. The inrush current control device according to claim 1, wherein the predetermined time interval is in nanoseconds to microseconds.

6. The inrush current control device according to claim 1, wherein the programmable counter unit counts an internal clock signal of the integrated circuit chip or an external clock signal.

7. The inrush current control device according to claim 1, wherein the power switch is a PMOS transistor whose gate receives the enable signal.

8. The inrush current control device according to claim 1, wherein the power switch is a NMOS transistor whose gate receives the enable signal.

9. The inrush current control device according to claim 1, wherein the integrated circuit chip is designed to be low power consumption.

10. An inrush current control method using an inrush current control device for an integrated circuit chip; wherein the integrated circuit has multiple functional units and M power switches which control power supply to the functional units; wherein the inrush current control device comprises a programmable counter unit having an input port receiving a clock signal, a selector unit having input ports connected to output ports of the programmable counter unit and N output ports, and an enable signal driving unit connected to the selector unit having N enable driving circuits; the inrush current control method comprising the following steps:

S1: dividing the M power switches into N groups, and connecting the N groups of the power switches respectively with the N enable signal driving circuits; connecting the N enable signal driving circuits respectively to the N output ports of the selector unit; wherein N and M positive integers, N is less than M;

S2: the programmable counter unit setting the predetermined counting value and counting the clock signal to control the selector unit to output the N enable signals to the N enable signal driving circuits at a predetermined time interval determined by the predetermined counting value, so as to switch on the N groups of the M power switches successively at the predetermined time interval to reduce transient inrush current.

* * * * *